US011243270B2

(12) United States Patent
Gillinger et al.

(10) Patent No.: US 11,243,270 B2
(45) Date of Patent: Feb. 8, 2022

(54) SENSOR CHIP AND ASSOCIATED CALIBRATION LEAD FRAME

(71) Applicant: Infineon Technologies AG, Neubiberg (DE)

(72) Inventors: Manuel Gillinger, Feldkirchen (AT); Wolfgang Granig, Seeboden (AT)

(73) Assignee: Infineon Technologies AG

( * ) Notice: Subject to any disclaimer, the term of this patent is extended or adjusted under 35 U.S.C. 154(b) by 19 days.

(21) Appl. No.: 16/931,839

(22) Filed: Jul. 17, 2020

(65) Prior Publication Data

US 2021/0025949 A1 Jan. 28, 2021

(30) Foreign Application Priority Data

Jul. 22, 2019 (DE) .......................... 102019210845.8

(51) Int. Cl.
*G01R 33/07* (2006.01)
*G01R 33/00* (2006.01)
*G01R 33/09* (2006.01)

(52) U.S. Cl.
CPC ..... *G01R 33/0035* (2013.01); *G01R 33/0052* (2013.01); *G01R 33/0082* (2013.01); *G01R 33/07* (2013.01); *G01R 33/095* (2013.01)

(58) Field of Classification Search
CPC .......................... G01R 33/00; G01R 33/0035; G01R 33/0023; G01R 33/0017; G01R 31/3191; G01R 33/0052; G01R 33/0082; G01R 33/07; G01R 33/095; G01B 7/004; G01C 17/38; G06F 3/017; G06F 3/0346; G06F 3/012
See application file for complete search history.

(56) References Cited

U.S. PATENT DOCUMENTS

| 6,229,205 | B1 | 5/2001 | Jeong et al. | |
| 2009/0001964 | A1* | 1/2009 | Strzalkowski | ....... G01R 15/202 |
| | | | | 324/202 |
| 2009/0278245 | A1* | 11/2009 | Bonifield | ................ H01L 24/12 |
| | | | | 257/676 |

(Continued)

FOREIGN PATENT DOCUMENTS

JP H10303361 A 11/1998

*Primary Examiner* — Jermele M Hollington
*Assistant Examiner* — Taqi R Nasir
(74) *Attorney, Agent, or Firm* — Design IP (57) ABSTRACT

A packaged sensor chip includes a lead frame to which there is attached a sensor element designed to generate a sensor signal that depends on a magnetic field to which the sensor element is exposed; and a package therefor, wherein the lead frame has function terminals and wherein the lead frame has at least two calibration terminals that are arranged on two other opposing sides of the package, wherein the lead frame has conductive structures that connect the at least two calibration terminals, wherein the conductive structures are structured so as to generate a calibration magnetic field for the sensor element when a current flows through them, and wherein the conductive structures are part of a connection structure that connects a plurality of lead frames before the plurality of lead frames are disconnected from one another in a first direction in which the other two sides are opposite one another.

16 Claims, 4 Drawing Sheets

(56) References Cited

U.S. PATENT DOCUMENTS

| | | | |
|---|---|---|---|
| 2010/0123217 A1* | 5/2010 | Poeppel | H01L 25/0655 |
| | | | 257/536 |
| 2012/0112365 A1 | 5/2012 | Ausserlechner et al. | |
| 2012/0280341 A1 | 11/2012 | Franke | |
| 2017/0067980 A1 | 3/2017 | Thiagarajan et al. | |
| 2018/0158765 A1 | 6/2018 | Montero et al. | |
| 2019/0033347 A1 | 1/2019 | Takano et al. | |

* cited by examiner

SENSOR CHIP AND ASSOCIATED CALIBRATION LEAD FRAME

FIELD

The disclosure relates to a packaged sensor chip, to a lead frame structure for the packaged sensor chip and to a method for manufacturing such a sensor chip.

BACKGROUND

Developing and manufacturing inexpensive and accurate magnetic field sensors continues to represent a major challenge. Integrated magnetic field sensors nowadays require expensive calibration and testing means which, since they are not standardized, need to be developed individually for each product. Angle sensors or 3D sensors for magnetic fields in particular require complex angle or 3D calibration devices in order to be calibrated.

What is known as a WOC (wire-on-chip) has been developed for Hall sensors, in which WOC conductive wires around a vertically or laterally arranged Hall sensor element additionally generate a magnetic field when excited by an electric current. These wires are used to generate a local magnetic field by way of which the sensor is able to be calibrated and trimmed The WOC principle is based on a difference measurement method on two magnetic fields that are induced by two electrical conductors, wherein current for an excitation test and that generates a specific magnetic field is applied via in each case two copper contact pads that respectively form two ends of an electrical conductor.

A further concept, the so-called BWOC (backside wire on chip), consists in depositing an electrically conductive wire on a rear side of a wafer in order to generate the required magnetic field, by way of which it is possible to trim or calibrate magnetic field sensors. The concept may be used for any lateral measurement system, for example a giant magnetoresistance (GMR) or AMR (anisotropic magnetoresistive effect) and the like. Using a special arrangement, it would even be possible to use vertical sensitive devices such as Hall plates. A magnetic field is generated when a current flows through the BWOC. By suitably placing the BWOC below or along a Hall region, the magnetic field penetrates vertically into the sensor in an optimal manner and is able to be measured. In order to achieve a required field density on the sensor surface, a high current has to flow through the BWOC. The dimensions of the wires have to be great enough to be able to transport the required amount of current. The required amount of current varies depending on a distance between the current-carrying wire and the sensor surface.

SUMMARY

It is desirable to provide a sensor chip that is able to be manufactured easily and inexpensively, wherein the reliability of the measurements performed thereby is at the same time able to be improved in comparison with conventional sensors or sensor chips.

As one example for achieving the object, what is provided is a packaged sensor chip having the following features:
a sensor element that is designed to generate a sensor signal that depends on a magnetic field to which the sensor element is exposed;
a lead frame to which the sensor element is attached; and
a package that packages the sensor element and the lead frame,
wherein the lead frame has function terminals that are arranged on at least one of two opposing sides of the package,
wherein the lead frame has at least two calibration terminals that are arranged on two other opposing sides of the package,
wherein the lead frame has conductive structures that connect the at least two calibration terminals, wherein the conductive structures are structured so as to generate a calibration magnetic field for the sensor element when a current flows through them, and wherein the conductive structures are part of a connection structure that connects a plurality of lead frames before the plurality of lead frames are disconnected from one another in a first direction in which the two other sides are opposite one another.

In other words, one general concept of the disclosure is that of using the lead frame as a source for a magnetic field in order to calibrate magnetically sensitive sensor elements. Using conductive structures that are part of the lead frame, it is not necessary to provide any dedicated lines for a current of a predetermined magnitude in order to generate a magnetic field, that is to say that these extra components do not need to be used. A further resultant advantage is that the distance between the current-carrying conductive structures that generate the magnetic field required for calibration are advantageously able to be made smaller with respect to the sensor. The packaged sensor chip provided with the lead frame according to the disclosure is thus able to have a flatter design. Due to the short distance between the current-carrying conductive structures and the sensor element to be calibrated, the magnitude of the predetermined current for generating a magnetic field required to calibrate the sensor element is likewise able to be minimized. This means that, in comparison with conventional sensor chips, a magnitude of the current for calibrating the sensor element is able to be reduced drastically in the case of the sensor chip according to the concept of the disclosure. Opposing or opposite sides within the meaning of the disclosure may also be understood to mean sides of the same sensor chip or lead frame that face away from one another.

A further aspect of the disclosure relates to a lead frame structure having the following features:
a multiplicity of lead frames, each of which is designed for the manufacture of a packaged sensor chip according to one of the aspects of the above description,
a multiplicity of connecting webs, wherein at least one connecting web is provided between in each case two lead frames that are adjacent in the first direction,
wherein the connection structure includes the conductive structures and the connecting webs, and wherein the connecting webs are designed to be severed when the lead frames are singulated, such that web ends remaining after the singulation form the calibration terminals. The connection structure that includes the conductive structures and the connecting webs may in this case particularly advantageously perform a plurality of functions that may be used for example during the manufacture of the sensor chip. Firstly, the individual connecting webs connect adjacent lead frames, wherein they ensure a mechanically stable connection of the individual lead frames, and secondly the same connecting webs may be used to calibrate the sensor chips. After the respective sensor chips have been singulated, the connecting webs furthermore also perform the function of calibration terminals by way of which a predetermined calibration current for setting the sensor elements of the sensor chip is able to be introduced into or routed through the conductive structures.

Yet another aspect of the disclosure relates to a method for manufacturing a multiplicity of packaged sensor chips, having the following features:

providing the lead frame structure according to one of the below examples;

applying at least one sensor element to a respective lead frame;

packaging the respective sensor elements and lead frames to form packaged sensor chips;

singulating the packaged sensor chips of the lead frame structure;

wherein the method includes a calibration operation of applying a current to at least some of the calibration terminals before and/or after the sensor chips are singulated. As described above, providing the lead frame structure according to the disclosure makes it possible firstly for the individual connecting webs to connect adjacent lead frames, wherein they ensure a mechanically stable connection of the individual lead frames, and secondly for the same connecting webs to be able to be used to calibrate the sensor chips. After the respective sensor chips have been singulated, the connecting webs furthermore also perform the function of calibration terminals by way of which a predetermined calibration current for setting the sensor elements of the sensor chip is able to be introduced into or routed through the conductive structures.

BRIEF DESCRIPTION OF THE DRAWINGS

A few examples are illustrated by way of example in the drawing and are explained below. In the figures.

DETAILED DESCRIPTION

Figure 1:
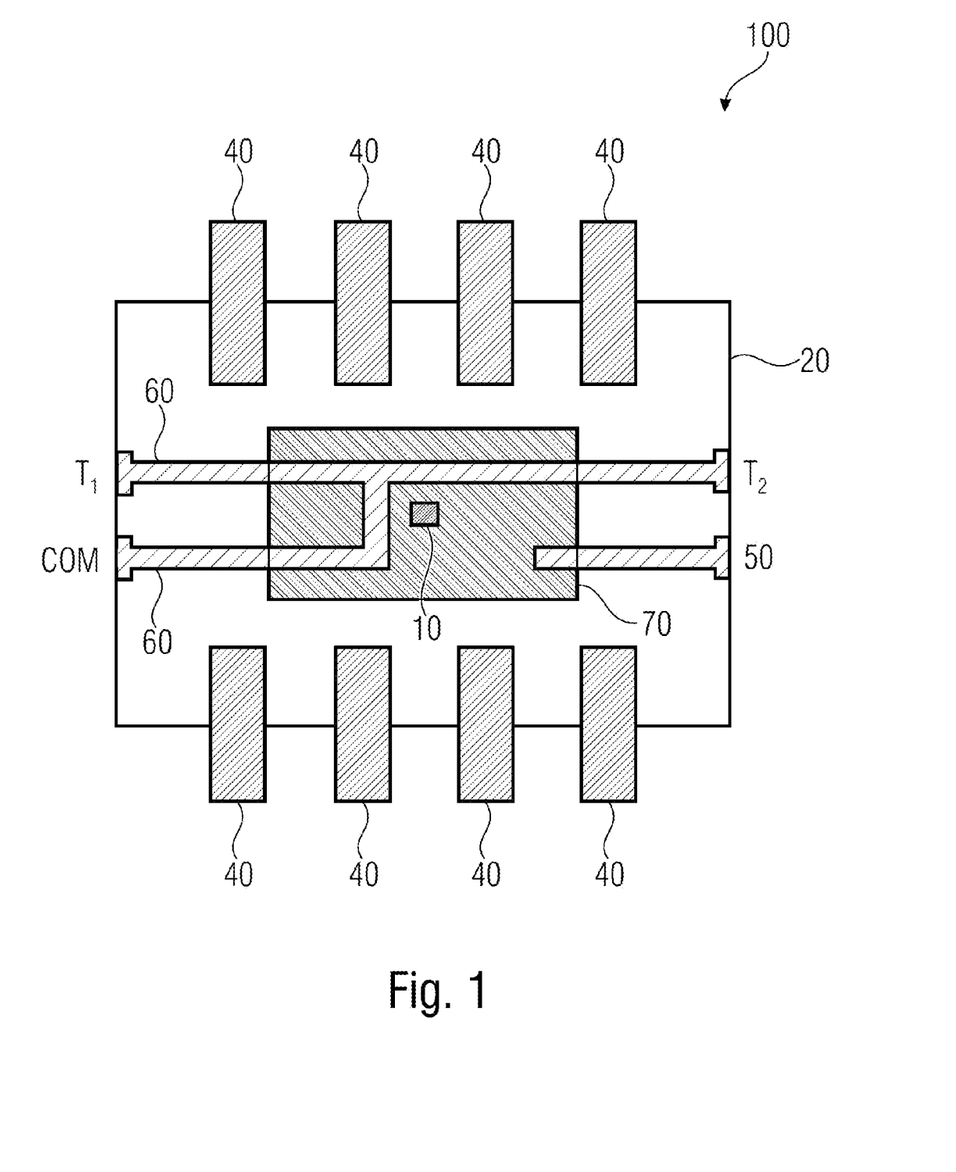
FIG. 1 shows a projection of a plan view onto a sensor chip having a lead frame according to one example.

FIG. 1 illustrates a projection of a plan view of a sensor chip 100 having a lead frame 20 by way of example. The sensor chip 100 has a package 30 of rectangular shape in the plan view (see FIGS. 2 and 3). According to further examples, the package 30 may be in the shape of a polygon or an ellipse. FIG. 1 illustrates, as part of the lead frame 20, function terminals 40 that are arranged on two opposing sides, or sides facing away from one another, of the package 30, and calibration terminals T1, T2, COM that are arranged on two other opposing sides, or sides facing away from one another, of the package 30. In the present example of FIG. 1, certain calibration terminals 50 are denoted even more specifically by the reference signs T1, T2 and COM. The lead frame 20 has a conductive structure 60 that connects the calibration terminals T1, T2 and COM to one another. The purpose of the conductive structure 60 is that of generating a calibration magnetic field for a sensor element 10 when a current flows through said structure. The sensor element 10 is in turn designed to generate a sensor signal that depends on a magnetic field to which the sensor element 10 is exposed. The sensor element 10 may in this case be any magnetically sensitive element, for example a magnetoresistive sensor, a Hall sensor, inductive sensors such as a conventional induction coil and the like. Further examples concern XMR (X-magnetoresistive) sensors such as spin-orbit torque or vortex structures.

The properties and advantages of the features in the examples given below apply equally to the packaged sensor chip, to the lead frame structure of the packaged sensor chip and to the method for manufacturing a multiplicity of packaged sensor chips by way of the lead frame structure. The respective features may be combined with one another.

In one advantageous example of the disclosure, the sensor element is galvanically coupled to at least some of the number of function terminals. The function terminals of the sensor chip constitute a connection or interface to the outside world, by way of which the sensor signals generated by the sensor element are able to be forwarded or other electrical devices are able to be made available. This may be for example a further measurement device and/or a control device that initiates predetermined method steps depending on the signal received from the sensor element of the sensor chip.

The conductive structures and/or their associated calibration terminals are expediently galvanically isolated from the function terminals. Galvanic isolation is essential in particular when the permitted currents or voltages that are routed through or applied to the calibration terminals or function terminals have different permitted threshold values. Apart from this, it is particularly advantageous to disconnect dedicated functions, according to one advantageous example, when certain parts of a circuit of the lead frame are no longer used, since the sensor chip as a whole is thereby able to be operated in an energy-saving manner.

In one example, at least two conductive structures and their associated calibration terminals are galvanically isolated from one another. Such isolation is particularly expedient when different currents for different purposes are routed through the associated calibration terminals of the respective conductive structures. On the basis of this, the respective conductive structures are able to be dimensioned differently in terms of predetermined physical properties to specific requirements. Galvanic isolation also makes it possible to avoid influencing the individual or respective conductive structures, for example when calibrating different sensor elements.

In one example, at least one conductor of the conductive structures extends in a straight line in the first direction, and/or at least one conductor of the conductive structures extends perpendicular to the first direction. The shortest connection between calibration terminals corresponds to the straight-line extension of the conductive structures in the first direction. Short connections are energy-efficient and also save material. By arranging at least one further conductor of a conductive structure perpendicular to the first direction and/or perpendicular to the conductive structure extending in a straight line in the first direction, it is possible for example to generate two magnetic fields perpendicular to one another when a predetermined current is routed through the conductive structures. The respective magnetic field that is generated may serve to calibrate a sensor element, for example a magnetic sensor of the sensor chip. The individual lines of the conductive structure may furthermore be used to route different currents adapted for individual sensor elements of the sensor chip—for example including currents that serve to calibrate the sensor elements. At least two conductive structures may furthermore also have an identical or parallel direction of extension, where a plausibility of the measured values when calibrating one or more sensor elements is thereby also able to be checked.

In a further example, the sensor element has a magnetic sensor. The arrangement described above of two conductors of the conductive structure that are perpendicular to one another is in particular suitable for calibrating a magnetic sensor by way of more than one generated magnetic field. One example of this would be a 2D (dimensional) sensor in which a predetermined magnetic field is able to be generated in each case independently in a predetermined direction. Both conductors of the conductive structures are thereby able to be measured independently of one another.

In a further example, the magnetic sensor has a Hall sensor and/or an XMR sensor and/or an inductive sensor. Hall sensors and/or XMR sensors may be dimensioned in a particularly small and space-saving manner, wherein they are capable of measuring magnetic fields of different directions and strengths. Particularly suitable in this case are Hall sensors for recording positions in a magnetic field—that is to say also that the Hall sensors are particularly suitable for recording magnetic fields with different directions.

In yet another example, the sensor chip has at least one further sensor element that is configured so as to record a state of the environment in which the sensor chip is located. A further sensor element is expedient when, using the sensor element, calibration of the sensor element depends on a further physical variable that is able to be recorded for example by way of a further sensor element. Taking into account the individual—sometimes complementary—influences of different physical variables makes it possible to calibrate sensor elements in a particularly accurate and reliable manner.

The further sensor element advantageously has a temperature sensor. By way of example, individual values that are recorded by way of magnetic sensors depend greatly on a temperature in the surroundings or a temperature of the magnetic sensor itself. When calibrating a magnetic sensor, it is accordingly advisable also to take into account the temperature or the influences of temperature in the calibration.

In order to be able to minimize the complementary influence of the individual sensor elements or their respective conductors of the conductive structures, the further sensor element has conductive structures and associated calibration terminals that are galvanically isolated from those of the sensor element. As a result of the galvanic isolation, the individual conductors of the conductive structures that are assigned to the respective sensor element may also for example have current applied to them alternately from one another or have the same currents applied to them at the same time or have different currents applied to them at the same time. Flexibility when calibrating or using the sensor elements or the sensor chip may thereby be increased.

The web ends of the connection structure or lead frame structure that remain after the singulation are expediently designed to be bonded to the package in a form-fitting and/or frictional manner. This ensures that the web ends do not interfere in the handling of the sensor chip.

In a further expedient example, the web ends remaining after the singulation are configured so as to be used as calibration terminals. The web ends may thus also be used as calibration terminals of the sensor chip—whether said chip is in its state bonded to the package or due to the fact that said calibration terminals are bent away during their use as calibration terminals and then bonded to the package again after the sensor element of the sensor chip has been calibrated.

One particular advantage of the method for manufacturing a multiplicity of packaged sensor chips having the features described above is that at least one sensor element is calibrated or is able to be calibrated after the sensor chips have been singulated. Subsequently, after the respective sensor chips have been singulated, it is therefore possible to check the calibration that has already been performed or to perform even more accurate trimming or calibration of the sensor element. The individual sensor chips may thereby be adapted specifically to the specific requirements for their use.

Sensitive sensors are able to be tested easily in the backend without specific magnetic units using such a system. This may reduce the test time and the costs of the testing means, which reduces the overall costs of the sensor chip. In combination with the BWOC (backside wire on chip) system, it is possible to test magnetic sensors on the front and rear side of production. In order to calibrate the sensor chip later on, said sensor chip may even be used during its application.

This concept may advantageously be applied to SMD (surface mount device) components that need to be measured individually due to limitations in the production process; for example when bending the function terminals and/or calibration terminals prior to forming, since otherwise voltage is introduced into the package. Such loading may lead to fluctuations in sensitivity of the sensor chip or sensor element. After the sensor chip has been manufactured, the calibration terminals may be bent or bonded along the package in order to form an additional contact pad for later and/or additional calibration. These contact pads may be used with special probe pins in order to route a current through the conductive structures of the connection structure of the sensor chip.

The above-described concept for calibrating sensor chips may also be used for strip measuring devices. Using a specific geometry of the lead frame, the calibration terminals may be extended such that they are able to be connected to sensor pins or probe pins.

Some examples offer the option of considerably reducing production costs of magnetic field sensors, in particular of sensors that operate with relational or differential fields, for example angle sensors, sensors robust to stray fields and current sensors. Even magnetic pulses may be generated in order to simulate toothed wheels for rate of rotation sensors.

In the above description, in some cases different features were grouped together in examples in order to rationalize the disclosure. This kind of disclosure should not be interpreted as being intended for the claimed examples to have more features than specified expressly in each claim. Rather, as set forth in the following claims, the subject matter may be present in less than all of the features of a single disclosed example. The following claims are therefore hereby incorporated into the detailed description, wherein each claim may exist as a standalone separate example. While each claim may exist as a standalone separate example, it is pointed out that, although dependent claims in the claims refer back to a specific combination with one or more other claims, other examples also comprise a combination of dependent claims with the subject matter of any other dependent claim or a combination of any feature with other dependent or independent claims. Such combinations are included, unless it is stated that a specific combination is not intended. It is furthermore also intended for a combination of features of a claim with any other independent claim to be included, even if this claim is not directly dependent on the independent claim.

Examples of the present disclosure are described in detail below using the attached descriptions. It is pointed out that identical elements or elements having the same functionality may be provided with identical or similar reference signs, a repeated description of elements provided with the same or similar reference signs typically being omitted. Descriptions of elements having identical or similar reference signs are mutually interchangeable. In the following description, many details are described in order to yield a more thorough explanation of examples of the disclosure. However, it is evident to those skilled in the art that other examples may be implemented without these specific details. Features of the various examples described may be combined with one another, unless features of a corresponding combination are mutually exclusive or such a combination is expressly excluded. Method steps that relate to a particular feature of a device are able to be exchanged with this feature of the device, this also applying the other way around.

FIG. 1 illustrates an example of a 2D sensor in which for example an X and Y magnetic field are able to be generated independently from one another in two different directions. The magnetic field generated in the X direction and the magnetic field generated in the Y direction are for example perpendicular to one another. In this case, the magnetic fields generated in the different directions may have strengths that differ from one another. According to the example of FIG. 1, the calibration magnetic field in each case perpendicular to the other may be generated by applying a current that flows from the calibration terminal T1 or T2 to a calibration terminal COM. In the illustrated example, a single conductor T2-COM extends in a straight line from T2 to COM in a first direction—between the shortest distance between two opposing sides—of the lead frame 20 of the sensor chip 100. It is thereby possible to save material, and losses caused by an electrical resistance occurring in the material of the conductor T2-COM are able to be minimized. A further conductor T1-COM, which leads from the calibration terminal T1 to the calibration terminal COM, is wired in the example of FIG. 1 such that the two conductors T1-COM, T2-COM are galvanically connected to one another. In order to generate the required calibration magnetic fields for the sensor element 10, in the present example, the respective current is routed successively through the individual conductors T1-COM and T2-COM.

In order that two or more calibration magnetic fields are able to be generated independently from one another and measured or recorded by the sensor element 10, according to a further advantageous example, the individual conductors T1-COM, T2-COM may be galvanically isolated from one another. As a result of the galvanic isolation, different dimensions of the individual conductors T1-COM, T2-COM are able to be adapted to predetermined currents for generating the calibration magnetic fields. In a further advantageous example, the individual function terminals 40 are likewise galvanically isolated from the conductive structures 60 and/or their associated calibration terminals T1, T2, COM. As a result of galvanic isolation, faults with individual functions of the sensor chip 100 caused by faulty wiring are able to be avoided.

In the example according to FIG. 1, the sensor element 10 is embedded on/in a wafer 70. The sensor element 10 is expediently arranged in the immediate vicinity of the conductive structure 60 generating the calibration magnetic field. This is desirable since the current generating the calibration magnetic field has to be selected depending on a predetermined distance between the sensor element 10 and the conductive structure 60. In this case, the strength of the calibration magnetic field decreases in proportion to the distance from the conductor generating the calibration magnetic field. Furthermore, it is also necessary to take into account a permeability of a material that may be arranged between the conductive structure 60 and the sensor element 10, for example the permeability of the material of the wafer 70. In order to achieve a required field density in the sensor element 10, high currents have to flow through the conductive structure 60 of the lead frame 20. Furthermore, the thickness of the wafer 70 also has a large influence on the required current. If it is possible to thin the wafer 70, for example 35 μm, as may be the case for example in the present example, the amount of current required to generate the calibration magnetic field decreases drastically. As a result, an influence of the current flowing through the conductive structures on other conductive structures—not shown here—of the sensor chip 100 is also able to be reduced.

According to a further example, the sensor chip 100 may have at least one further sensor element—not shown. The further sensor element is expediently configured so as to record a state of the environment in which the sensor chip 100 is located. It is advantageous if the further sensor element is designed as a temperature sensor. This is particularly advantageous when the sensor element 10 of the sensor chip 100 has a magnetic sensor. Magnetic sensors respond differently at varying temperatures. The measurements of the magnetic sensor are able to be recorded more accurately and/or checked for plausibility by way of a further sensor element designed as a temperature sensor.

Generating magnetic fields or calibration magnetic fields through large currents through the lead frame 20 allows an additional improvement option in the case of calibration taking into account the temperature without providing additional calibration terminals, other than the already provided calibration terminals T1, T2, COM or conductors T1-COM, T2-COM of the conductive structures 60, since thermal losses and heat are also generated by the flow of current during current excitation in order to generate a calibration magnetic field. The temperature may increase constantly during the calibration process. According to one expedient example, individual measurement points for the magnetic field or calibration magnetic field including the temperature may be performed in and with one and the same test application.

Different combinations of a calibration of the sensor chip 100 are thereby able to be performed. In this case, the various conductors T1-COM, T2-COM of the conductive structure 60 and the associated calibration terminals T1, T2, COM may be used to calibrate identical and/or different sensor elements 10.

Figure 2:
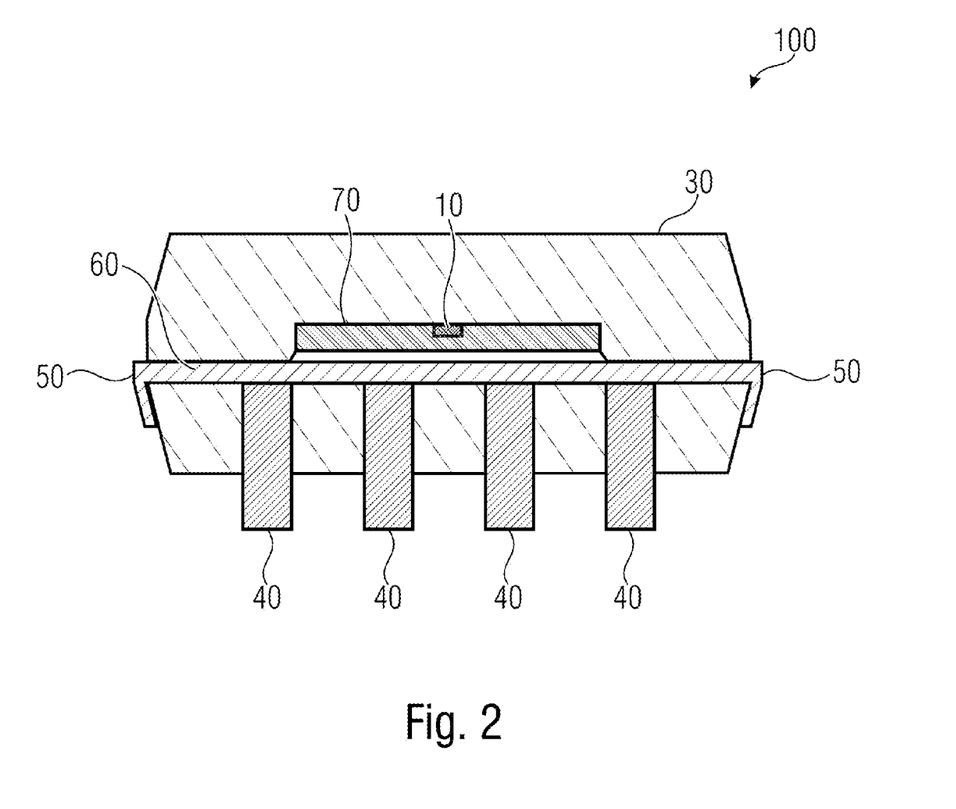
FIG. 2 shows a projection of a side view of the sensor chip having the lead frame according to the example from FIG. 1.

FIG. 2 illustrates a projection of a side view of the sensor chip 100 having a lead frame 20 according to the example from FIG. 1. In this case, it is possible to see an arrangement of the individual elements forming the sensor chip 100. The function terminals 40 serve to control the sensor chip 100 or as an interface for providing recorded or measured sensor signals of the sensor element 10. Together with the conductive structure 60 with the calibration terminals T1, T2, COM connected thereto, they form part of the lead frame 20. A wafer 70 in or on which the sensor element 10 is embedded is arranged parallel to a plane of the conductive structure 60. The wafer 70 that is illustrated may be formed so as to be particularly thin and has a thickness similar or identical to the conductive structure 60. As already mentioned above in the discussion regarding FIG. 1, a smaller distance between the sensor element 10 and the conductor T1-COM, T2-COM generating a calibration magnetic field is particularly advantageous, since currents that flow through the calibration terminals T1, T2, COM into the conductive structure 60 in order to generate a calibration magnetic field are able to be chosen to be smaller, wherein a loss through resistance-induced development of heat by the conductive structure 60 is thereby also able to be reduced, and the entire lead frame 20 and the sensor chip 100 are exposed to lower loading. By reducing the development of heat, it is also possible to reliably record—independently from the influences of the development of heat—the sensor signals of the sensor element 10.

The example illustrated in FIG. 2 shows a sensor chip 100 in one embodiment of an SMD (surface mount device). The individual calibration terminals T1, T2, COM are in this case bonded to a surface of the package 30 of the sensor chip 100. In one advantageous example, the calibration terminals T1, T2, COM may also be used as calibration terminals T1, T2, COM even after the respective sensor chips 100 have been singulated from a lead frame structure 200 that comprises a plurality of lead frames 20, wherein the calibration terminals provide surfaces able to come into contact with measurement or probe pins. In order to guarantee reliable operation when calibrating the sensor chip 100, the calibration terminals T1, T2, COM are bonded to the package 30 in a form-fitting and/or frictional manner. If necessary, the calibration terminals T1, T2, COM bonded to the package 30 of the sensor chip 100 may also once more be bent away from the package 30 and back again.

Figure 3:
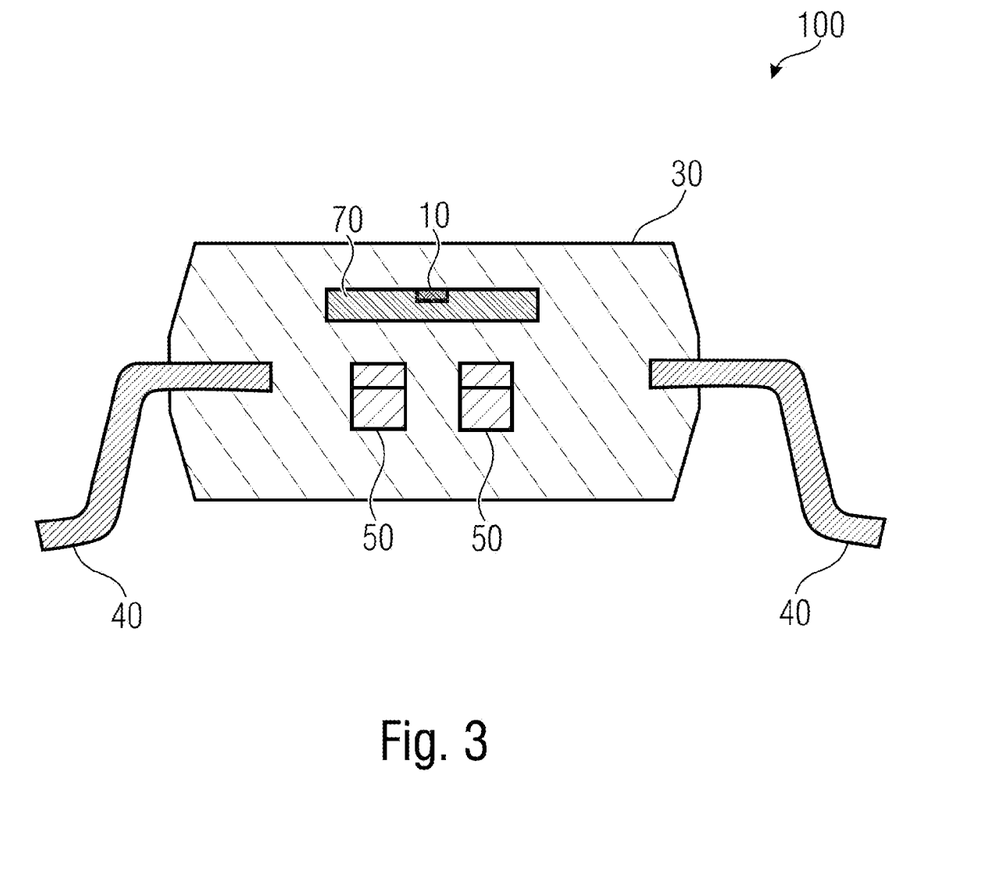
FIG. 3 shows a projection of a side view of the sensor chip from FIG. 2 rotated by 90° and having the lead frame according to the example from FIG. 1.

FIG. 3 shows a projection of a side view of the sensor chip 100 from FIG. 2 rotated by 90° and having the lead frame 20 according to the example from FIG. 1 or FIG. 2. FIG. 3 in particular shows a bent structure of the function terminals 40 emerging laterally from the package 30 of the sensor chip 100. By bending the function terminals 40, these are able to be changed in terms of their physical properties—this also includes changing them to the extent that the sensor chip 100 becomes unusable. Accordingly, the function terminals 40 would also not be suitable for calibrating the sensor element 10 of the sensor chip 100 to the same extent, since accurate calibration of the sensor element 10 is not readily able to be guaranteed. For this reason, in the example of the sensor chip 100, dedicated calibration terminals T1, T2 and COM are provided in order to be able to reliably calibrate the sensor element 10; this being the case even after the sensor chip 100 itself is manufactured, wherein the calibration terminals T1, T2 and COM bonded to the package 30 of the sensor chip 100 may be used.

The illustration, given in these explanations, of a sensor chip 100 having a sensor element 10 should be understood only to be a representative example, wherein different combinations of two or more sensor elements—not shown—which may be of the same type or of different types, may be manufactured and calibrated in accordance with the concept of the illustrated examples.

Figure 4:
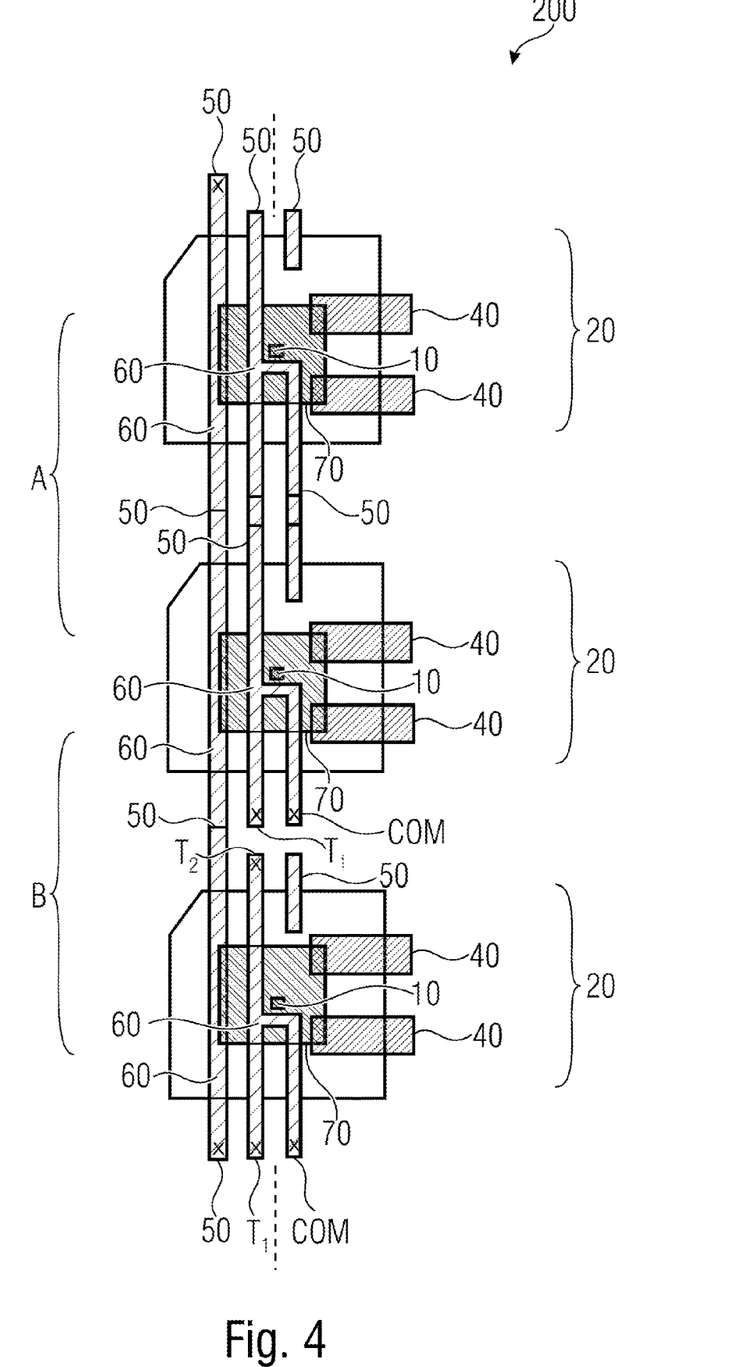
FIG. 4 shows a lead frame structure having a multiplicity of lead frames that are able to be held together and calibrated via a plurality of connecting webs of a connection structure according to one advantageous example.

FIG. 4 illustrates a lead frame structure 200 having a multiplicity of lead frames 20 that are able to be held together and calibrated via a plurality of connecting webs 50 of a connection structure 50, 60 according to one advantageous example.

In the illustrated example, a plurality of individual lead frames 20 are connected to form a belt-shaped or strip-shaped lead frame structure 200, wherein the individual lead frames 20 may serve to respectively manufacture a packaged sensor chip 100, such as for example one that has been explained in the above FIGS. 1 to 3. The individual lead frames 20 have a multiplicity of connecting webs 50, wherein at least one connecting web 50 is in each case provided between two adjacent lead frames 20 of the lead frame structure 200. The connecting webs 50 are in this case arranged between two opposing sides of two adjacent lead frames 20 that comprise or form the respective calibration terminals T1, T2 and COM, such that a connection structure 50, 60 of the individual lead frames 20 comprises the conductive structures 60 and the connecting webs 50. In this case, the connecting webs 50 are designed to be severed when the lead frames 20 of the sensor chips 100 are singulated, such that web ends remaining after the singulation form the calibration terminals T1, T2 and COM. In the illustrated example of FIG. 4, the respective lead frames 20 are connected to one another via in each case three connecting webs 50 to form the lead frame structure 200. In this case, the individual lead frames 20 each have a sensor element 10, for example a magnetic sensor, embedded on or in a wafer 70. According to examples not illustrated here, the number of connecting webs 50 or the number of sensor elements 10 of the respective lead frame structure may vary.

The concept of the lead frame structure 200 is explained in greatly simplified form below in connection with a few method steps for manufacturing and/or calibrating a multiplicity of packaged sensor chips 100.

A first section A of FIG. 4 illustrates a state of the lead frame structure 200 that is present when producing a multiplicity of packaged sensor chips 100 before the individual sensor chips 100 are singulated or severed. In this case, the individual lead frames 20 are also connected to one another via the connecting webs 50, such that a plurality of lead frames 20 of the lead frame structure 200 are in the form of a lead frame belt or a lead frame strip.

A second section B of FIG. 4 illustrates a state of the lead frame structure 200 in which the individual lead frames 20 or produced sensor chips 100 are still held together only in part via a connecting web 50, wherein in each case two of the three connecting webs 50 have already been severed, wherein they each form the calibration terminals T1, T2, COM of one of the sensor chip 100 or lead frame 20. In the present example, the individual sensor elements 10 of the sensor chips 100 are able to be calibrated via sensor pins or probe pins that are able to be applied to the individual calibration terminals.

According to the concept explained above, it is also possible to use a lead frame structure 200 formed by lead frames 20 in/for strip measuring devices. With a specific geometry, for example that of FIGS. 1 to 3, of the lead frame 20, the respective calibration terminals T1, T2, COM of the individual lead frames 20 may be designed or tailored such that they are able to be connected to sensor pins. FIG. 4 shows part of the lead frame structure 200 that is designed as a lead frame strip or belt and provides possible contact points, which are marked as points x in FIG. 4, or calibration terminals T1, T2, COM for sensor pins.

According to a further example, the sensor chips 100 produced after singulation—that is to say final severing of the lead frames 20 of the lead frame structure 200 from one another—may furthermore be calibrated individually by applying a current to at least some of the calibration terminals T1, T2 and COM. According to further examples not illustrated here, part of a calibration may be performed in the state according to section A, whereas a further, for example a checking calibration step, may be performed in the state according to section B and/or a calibration step may be performed in the singulated state of a sensor chip 100—cf. FIGS. 1 to 3. High flexibility in the manufacture or calibration of the sensor elements 10 or sensor chips 100 according to the examples illustrated above is thereby possible.

The above-described examples are merely an illustration of the principles of the present concept. It is to be understood that modifications and variations of the arrangements and details described in this document will be obvious to others skilled in the art. For this reason, the concept is intended to be limited merely by the scope of protection of the following patent claims rather than by the specific details which have been presented on the basis of the description and the explanation of the examples in this document.

LIST OF REFERENCE SIGNS

100 Sensor chip
200 Lead frame structure
10 Sensor element
20 Lead frame
30 Package
40 Function terminal
50 Connecting web (becomes a calibration terminal after the sensor chips have been singulated)
60 Conductive structures
50, 60 Connection structure
70 Wafer
COM Calibration terminal
T1 Calibration terminal
T2 Calibration terminal
T1-COM Conductor of the conductive structure
T2-COM Conductor of the conductive structure

What is claimed is:

1. A packaged sensor chip, comprising:
a sensor element that is configured to generate a sensor signal that depends on a magnetic field to which the sensor element is exposed;
a lead frame to which the sensor element is attached; and
a package that packages the sensor element and the lead frame,
wherein the lead frame has function terminals that are arranged on at least one of two first opposing sides of the package,
wherein the lead frame has at least two calibration terminals that are arranged on two second opposing sides of the package,
wherein the lead frame has conductive structures that connect the at least two calibration terminals, wherein the conductive structures are structured so as to generate a calibration magnetic field for the sensor element when a current flows through the conductive structures, and
wherein the conductive structures are part of a connection structure that connects a plurality of lead frames before the plurality of lead frames are singulated from one another in a first direction, the direction of which the two second opposing sides are opposite one another.

2. The packaged sensor chip as claimed in claim 1, wherein:
the sensor element is galvanically connected to at least one of the function terminals.

3. The packaged sensor chip as claimed in claim 1, wherein:
the conductive structures and the at least two calibration terminals are galvanically isolated from the function terminals.

4. The packaged sensor chip as claimed in claim 3, wherein:
at least two of the conductive structures and their associated calibration terminals are galvanically isolated from one another.

5. The packaged sensor chip as claimed in claim 1, wherein:
at least one first conductive structure of the conductive structures extends in a straight line in the first direction, and
at least one second conductive structure of the conductive structures extends perpendicular to the first direction.

6. The packaged sensor chip as claimed in claim 1, wherein:
the sensor element has a magnetic sensor.

7. The packaged sensor chip as claimed in claim 6, wherein:
the magnetic sensor has a Hall sensor, an XMR sensor, or an inductive sensor.

8. The packaged sensor chip as claimed in claim 1, wherein:
the sensor chip includes at least one further sensor element that is configured so as to record a state of an environment in which the sensor chip is located.

9. The packaged sensor chip as claimed in claim 8, wherein:
the further sensor element includes a temperature sensor.

10. The packaged sensor chip as claimed in claim 8, wherein:
the further sensor element includes further conductive structures and further calibration terminals associated with the further conductive structures, wherein the further conductive structures are galvanically isolated from the conductive structures of the sensor element.

11. A lead frame structure, comprising:
a plurality of packaged sensor chips coupled together in a chain along a first direction, wherein each of the plurality of packaged sensor chips comprises:
a sensor element that is configured to generate a sensor signal that depends on a magnetic field to which the sensor element is exposed;
a lead frame to which the sensor element is attached; and
a package that packages the sensor element and the lead frame,
wherein the lead frame has function terminals that are arranged on at least one of two first opposing sides of the package,
wherein the lead frame has at least two calibration terminals that are arranged on two second opposing sides of the package,
wherein the lead frame has conductive structures that connect the at least two calibration terminals, wherein the conductive structures are structured so as to generate a calibration magnetic field for the sensor element when a current flows through the conductive structures, and
wherein the conductive structures are part of a connection structure that connects a plurality of lead frames before the plurality of lead frames are singulated from one another in the first direction, the direction of which the two second opposing sides are opposite one another,
wherein each of the plurality of packaged sensor chips is coupled to at least one adjacent packaged sensor chip in the first direction; and
a plurality of connecting webs, wherein the lead frames of each pair adjacent packaged sensor chips of the plurality of packaged sensor chips are connected together by at least one connecting web in the first direction, wherein the connection structure of each lead frame comprises the conductive structures and the at least one connecting web, and wherein the plurality of connecting webs are configured to be severed when the plurality of lead frames are singulated, such that web ends of the plurality of connecting webs remaining after the singulation form the calibration terminals.

12. The lead frame structure as claimed in claim 11, wherein:

the web ends remaining after the singulation are configured to be bonded to the package in a form-fitting or frictional manner.

13. The lead frame structure as claimed in claim 11, wherein:

the web ends remaining after the singulation are configured so as to be used as calibration terminals.

14. A method for manufacturing a plurality of packaged sensor chips, comprising:

providing the lead frame structure comprising a plurality of lead frames coupled together in a chain along a first direction, wherein each respective lead frame of the plurality of lead frames comprises:

function terminals that are arranged on at least one of two first opposing sides of a package that packages the respective lead frame, at least two calibration terminals that are arranged on two second opposing sides of the corresponding package, conductive structures that connect the at least two calibration terminals, and at least one connecting web, wherein the conductive structures are structured so as to generate a calibration magnetic field for the sensor element when a current flows through the conductive structures, and wherein the conductive structures are part of a connection structure that connects a plurality of lead frames via a plurality of connecting webs before the plurality of lead frames are singulated from one another in the first direction, the direction of which the two second opposing sides are opposite one another;

applying at least one sensor element to each respective lead frame;

packaging respective sensor elements and respective lead frames to form a plurality of packaged sensor chips coupled together in a chain along a first direction via the plurality of connecting webs;

singulating the plurality of packaged sensor chips that are coupled together by the lead frame structure; and performing a calibration operation of applying a current to at least some of the calibration terminals before or after the plurality of packaged sensor chips are singulated.

15. The method as claimed in claim 14, wherein:

at least one sensor element is calibrated after the plurality of packaged sensor chips have been singulated.

16. The method as claimed in claim 14, wherein:

the calibration operation is performed before and after the plurality of packaged sensor chips are singulated.

* * * * *